(12) United States Patent
Liu

(10) Patent No.: US 7,641,939 B2
(45) Date of Patent: Jan. 5, 2010

(54) CHEMICAL VAPOR DEPOSITION REACTOR HAVING MULTIPLE INLETS

(75) Inventor: Heng Liu, Sunnyvale, CA (US)

(73) Assignee: Bridgelux, Inc., San Jose, CA (US)

( * ) Notice: Subject to any disclaimer, the term of this patent is extended or adjusted under 35 U.S.C. 154(b) by 0 days.

(21) Appl. No.: 11/932,293

(22) Filed: Oct. 31, 2007

(65) Prior Publication Data

US 2008/0057197 A1    Mar. 6, 2008

Related U.S. Application Data

(63) Continuation of application No. 11/064,984, filed on Feb. 23, 2005, which is a continuation-in-part of application No. 10/621,049, filed on Jul. 15, 2003, now abandoned.

(51) Int. Cl.
    *C23C 16/00* (2006.01)
(52) U.S. Cl. .................................. 427/255.28
(58) Field of Classification Search ............. 427/255.28
    See application file for complete search history.

(56) References Cited

U.S. PATENT DOCUMENTS

| | | | |
|---|---|---|---|
| 3,757,733 A | 9/1973 | Reinberg | |
| 4,798,166 A | 1/1989 | Hirooka et al. | |
| 4,812,331 A | 3/1989 | Hirooka et al. | |
| 4,961,399 A * | 10/1990 | Frijlink | 118/730 |
| 4,980,204 A * | 12/1990 | Fujii et al. | 117/98 |
| 5,281,295 A | 1/1994 | Maeda et al. | |
| 5,334,277 A | 8/1994 | Nakamura | |
| 5,453,124 A | 9/1995 | Moslehi et al. | |
| 5,458,724 A | 10/1995 | Syverson et al. | |
| 5,595,606 A | 1/1997 | Fujikawa et al. | |
| 5,653,808 A | 8/1997 | MacLeish et al. | |
| 6,080,241 A | 6/2000 | Li et al. | |
| 6,113,705 A | 9/2000 | Ohashi et al. | |
| 6,113,984 A | 9/2000 | MacLeish et al. | |
| 6,143,077 A | 11/2000 | Ikeda et al. | |
| 6,165,311 A | 12/2000 | Collins et al. | |
| 6,197,121 B1 | 3/2001 | Gurary et al. | |
| 6,465,043 B1 | 10/2002 | Gupta | |
| 6,764,546 B2 | 7/2004 | Faajimakers | |
| 6,812,157 B1 | 11/2004 | Gadgil | |

(Continued)

FOREIGN PATENT DOCUMENTS

JP    62211914    9/1987

(Continued)

OTHER PUBLICATIONS

Woelk et al, Metalorganic Vapor Phase Epitaxy for Specialty Semiconductor Devices, Aerospace Conference Proceedings IEEE 2000, vol. 5, p. 439-444.*

(Continued)

*Primary Examiner*—Timothy H Meeks
*Assistant Examiner*—Elizabeth Burkhart
(74) *Attorney, Agent, or Firm*—Haynes and Boone, LLP

(57) ABSTRACT

A chemical vapor deposition reactor has a wafer carrier which cooperates with a chamber of the reactor to facilitate laminar flow of reaction gas within the chamber and a plurality of injectors configured in flow controllable zones so as to mitigate depletion.

8 Claims, 13 Drawing Sheets

U.S. PATENT DOCUMENTS

| | | |
|---|---|---|
| 6,843,882 B2 | 1/2005 | Janakiraman et al. |
| 2001/0007244 A1 | 7/2001 | Matsuse |
| 2002/0054745 A1 | 5/2002 | Van de Walle et al. |
| 2003/0005886 A1 | 1/2003 | Park et al. |
| 2003/0005958 A1 | 1/2003 | Rocha-Alvarez et al. |
| 2003/0094903 A1 | 5/2003 | Tao et al. |
| 2003/0133854 A1 | 7/2003 | Tabata et al. |
| 2004/0099213 A1 | 5/2004 | Adomaitis et al. |
| 2004/0216668 A1 | 11/2004 | Lindfors et al. |

FOREIGN PATENT DOCUMENTS

| | | |
|---|---|---|
| WO | WO 02/18672 | 3/2002 |

OTHER PUBLICATIONS

Juergensen, MOCVD technology in research, development, and mass production, Materials Science in Semiconductor Processing 4 (2001), p. 467-474.*

Theodoropoulos et al, Design of gas inlets for the growth of gallium nitride by metalorganic vapor phase epitaxy, Journal of Crystal Growth 217 (2000), p. 65-81.*

U.S. Appl. No. 11/740,736, filed Apr. 26, 2007, Heng Liu.*
U.S. Appl. No. 11/064,984, filed Feb. 23, 2005, Heng Liu.*
U.S. Appl. No. 10/727,746, filed Dec. 3, 2003, Heng Liu.*
U.S. Appl. No. 12/273,943, filed Nov. 19, 2008, Heng Liu.*

H. Jürgensen et al., "MOCVD Equipment for Recent Developments Towards the Blue and Green Solid State Laser", MRS Internet Journal of Nitride Semiconductor Research, vol. 1, Article 26, published 1996.

Thomas Swan, "CVD Reactor", Source Unknown, Date of publication predates date of application filing.

Aixtron of Germany, "Planetary Reactor" Source Unknown, Date of publication predates date of application filing.

J. Dai "Atmospheric Pressure MOCVD Growth of High-Quality ZnO Films on A1 0 Templates", Journal of Crystal Growth 283 (2005), pp. 93-99.

Thomas Swan, "CVD Reactor", Source Unknown, Date of publication predates date of application filing.

* cited by examiner

CHEMICAL VAPOR DEPOSITION REACTOR HAVING MULTIPLE INLETS

RELATED APPLICATION

This patent application is a continuation of patent application of co-pending patent application Ser. No. 11/064,984, filed Feb. 23, 2005 which is a continuation-in-part (CIP) patent application of now abandoned patent application Ser. No. 10/621,049, filed Jul. 15, 2003 and entitled CHEMICAL VAPOR DEPOSITION REACTOR, the entire contents of which are hereby incorporated explicitly by reference.

FIELD OF THE INVENTION

The present invention relates generally to chemical vapor deposition (CVD) reactors, such as those used for group III-V semiconductor epitaxy. The present invention relates more particularly to a CVD reactor that is configured to provide laminar flow of reactant gases while mitigating undesirable depletion of reactants, so as to achieve enhanced deposition uniformity.

BACKGROUND OF THE INVENTION

Metal organic chemical vapor deposition (MOCVD) of group III-V compounds is a thin film deposition process utilizing a chemical reaction between a periodic table group III organic metal and a periodic table group V hydride. Various combinations of group III organic metal and group V hydride are possible.

This process is commonly used in the fabrication of semiconductor devices, such as light emitting diodes (LEDs). The process usually takes place in a chemical vapor deposition (CVD) reactor. CVD reactor design is a critical factor in achieving the high quality films that are required for semiconductor fabrication.

In general, the gas flow dynamics for high quality film deposition favor laminar flow. Laminar flow, as opposed to convective flow, is required to achieve high growth efficiency and uniformity. Several reactor designs are commercially available to provide laminar growth condition on a large scale, i.e., high throughput. These designs include the rotating disk reactor (RDR), the planetary rotating reactor (PRR) and the close-coupled showerhead (CCS).

However, such contemporary reactors suffer from inherent deficiencies which detract from their overall desirability, particularly with respect to high pressure and/or high temperature CVD processes. Such contemporary reactors generally work well at low pressures and relatively low temperatures (such as 30 torr and 700° C., for example). Therefore, they are generally suitable for growing GaAs, InP based compounds.

However, when growing group III nitride based compounds (such as GaN, AlN, InN, AlGaN, and InGaN), there are factors that become important when using such contemporary reactors. Unlike GaAs or InP based material, group III Nitride is preferably grown at substantially higher pressures and temperatures (generally greater that 500 torr and greater than 1000° C.). When using the aforementioned reactor designs under high pressure and temperature conditions, heavy thermal convection inherently occurs. Such thermal convection undesirably interferes with the growth process, so as to degrade efficiency and yield.

This situation worsens when the gas phase is majority ammonia. Ammonia is commonly used as nitrogen source in the III nitride MOCVD process. Ammonia is much more viscous than hydrogen. When the ambient gas contains a high percentage of ammonia, thermal convection occurs more easily than when the ambient gas is majority hydrogen, which is the case for GaAs or InP based MOCVD growth. Thermal convection is detrimental to growing high quality thin films since hard-to-control complex chemical reactions occur due to the extended duration of the presence of reactant gases in the growth chamber. This inherently results in a decrease in growth efficiency and poor film uniformity.

According to contemporary practice, a large gas flow rate is typically utilized in order to suppress undesirable thermal convection. In the growth of group III nitride, this is done by increasing the ambient gas flow rate, wherein the gas is typically a mixture of ammonia with either hydrogen or nitrogen. Therefore, high consumption of ammonia results, particularly at high growth pressure conditions. This high consumption of ammonia results in the corresponding high costs.

Reaction between source chemicals in the gas phase is another important issue in the contemporary MOCVD process for growth of GaN. This reaction also occurs in the growth of other group III-Nitrides, such as AlGaN and InGaN. Gas phase reaction is usually not desirable. However, it is not avoidable in the group III nitride MOCVD process because the reaction is severe and fast.

When the group III alkyls (such as trimethylgallium, trimethylindium, trimethylaluminum) encounter ammonia, a reaction occurs almost immediately, resulting in the undesirable formation of adducts Usually, when these reactions occur after all the source gases enter the growth chamber, the adducts produced will participate in the actually growth process. However, if the reactions happen before or near the gas entrance of the growth chamber, the adducts produced will have an opportunity to adhere to the solid surface. If this happens, the adducts which adhere to the surface will act as gathering centers and more and more adduct will consequently tend to accumulate. This process will eventually deplete the sources, thereby making the growth process undesirably vary between runs and/or will clog the gas entrance.

An efficient reactor design for III-nitride growth does not avoid gas phase reaction, but rather controls the reaction so that it does not create such undesirable situations.

Because the demand for GaN based blue and green LEDs have increased dramatically in recent years, throughput requirements from production reactors have become important. The contemporary approach to scale up production is typically to build larger reactors. The number of wafers produced during each run has increased from 6 wafers to more than 20 wafers, while maintaining same number of runs per day, in currently available commercial reactors.

However, when a reactor is scaled up this way, several new issues arise. Because thermal convection is as severe (or even more severe) in a larger reactor as in a smaller reactor, film uniformity, as well as wafer-to-wafer uniformity, are not any better (and may be much worse). Further, at higher growth pressures, a very high gas flow rate is needed to suppress thermal convection. The amount of gas flow needed is so high that modification and special considerations are required for the gas delivery system.

Additionally, because of the high temperature requirements, the larger mechanical parts of such a scaled up (larger) reactor are inherently placed under higher thermal stress and consequently tend to break prematurely. In almost all reactor constructions, stainless steel, graphite and quartz are the most commonly used materials. Because of hydrogenation of the metals utilized (making them become brittle) and because of etching of graphite by ammonia at high temperatures, the larger metal and graphite parts tend to break down much sooner than the corresponding parts of smaller reactors. Larger quartz parts also become more susceptible to breakage because higher thermal stress.

Another issue associated with large size reactors is the difficulty in maintaining high temperature uniformity. Thickness and composition uniformity can be immediately affected by the temperature uniformity of the wafer carrier surface. In large size reactors, temperature uniformity is achieved by using a multi-zone heating configuration that is complex in design. The reliability of the heater assembly is usually poor due to the aforementioned high thermal stress and ammonia degradation. These issues of process inconsistency and extensive hardware maintenance have a significant impact on production yield and therefore product cost.

Referring now to FIG. 1, an example of a contemporary RDR reactor for use in GaN epitaxy is shown schematically. The reaction chamber has a double-walled water-cooled 10" cylinder 11, a flow flange 12 where all the reaction or source gases are distributed and delivered into chamber 13, a rotation assembly 14 that spins the wafer carrier 16 at several hundreds of rotations per minute, a heater 17 assembly underneath the spinning wafer carrier 16 configured to heat wafers 10 to desired process temperatures, a pass through 18 to facilitate wafer carrier transfer in and out of the chamber 13, and an exhaust 19 at the center of the bottom side of the chamber 13. An externally driven spindle 21 effects rotation of the wafer carrier 16. The wafer carrier 16 comprises a plurality of pockets, each of which is configured to contain a wafer 10.

The heater 17 comprises two sets of heating elements. An inner set of heating elements 41 heats the central portion of the wafer carrier 16 and an outer set of heating elements 42 heats the periphery of the wafer carrier 16. Because the heater 17 is inside of the chamber 13, it is exposed to the detrimental effects of the reaction gases.

The spindle rotates the wafer carrier at between 500 and 1000 rpm.

As discussed previously, this design works well at lower pressures and temperatures, especially when the ambient gas is low viscosity. However, when growing GaN at high pressures and temperatures in a high ammonia ambient gas, then thermal convection occurs and gas flow tends to be undesirably turbulent.

Referring now to FIG. 2, a simplified gas streamline is shown to illustrate this turbulence. It is clear that turbulence increase as the size of the chamber and/or the distance between the wafer carrier and the top of the chamber increases. When the design of FIG. 1 is scaled up for higher throughput, the chamber 13, as well as the wafer carrier 16, is enlarged to support and contain more wafers.

Gas recirculation cells 50 tend to form when there is turbulence in the ambient gas. As those skilled in the art will appreciate, such recirculation is undesirable because it results in undesirable variations in reactant concentration and temperature. Further, such recirculation generally results in reduced growth efficiency due to ineffective use of the reactant gas.

Further, more heating zones are required in a larger reactor. This, of course, undesirably complicates the construction of such larger reactors and increases the cost thereof.

Referring now to FIGS. 3A and 3B, a comparison between a 7" six pocket wafer carrier 16a (which supports six wafers as shown in FIG. 3A) and a 12" twenty pocket wafer carrier 16b (which supports twenty wafers as shown in FIG. 3b) can easily be made. Each pocket 22 supports a single 2" round wafer. From this comparison, it is clear that such scaling up of a reactor to accommodate more wafers greatly increases the size, particularly the volume, thereof. This increase in the size of the reactor results in the undesirable effects of thermal convection and the additional complexities of construction discussed above.

It is well known, however, that the depletion effect is one major drawback in contemporary horizontal reactors. As reactants in the carrier gas proceed from the center toward the peripheral of the rotating disk, a substantial amount of the reactants is consumed along the way. This undesirably makes the thin film deposited thinner and thinner along the radial direction upon the wafer.

One contemporary approach to reduce the depletion effect is to use a high gas flow rate to reduce the concentration gradient along the radial direction. The drawback of this approach is an inherent decrease in growth efficiency.

In view of the foregoing, it is desirable to provide a reactor which is not substantially susceptible to the undesirable effects of thermal convection and which can easily and economically be scaled up so as to increase throughput. It is further desirable to provide a reactor which has enhanced growth efficiency (such as by providing mixing of reactant gases immediately proximate a growth region of the wafers and by assuring intimate contact of the reactant gases with the growth region). It is yet further desirable to provide a reactor wherein the heater is outside of the chamber thereof, and is thus not exposed to the detrimental effects of the reaction gases. It is yet further desirable to mitigate the undesirable effects of depletion while maintaining growth efficiency, so as to provide enhanced deposition uniformity over the entire wafer.

BRIEF SUMMARY OF THE INVENTION

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

The present invention specifically addresses and alleviates the above mentioned deficiencies associated with the prior art. More particularly, according to one aspect, the present invention comprises a chemical vapor deposition reactor comprising a rotatable wafer carrier which cooperates with a chamber of the reactor to facilitate laminar flow of reaction gas within the chamber.

According to another aspect, the present invention comprises a chemical vapor deposition reactor comprising a rotatable wafer carrier which is sealed at a periphery thereof to a chamber of the reactor such that laminar flow within the chamber is facilitated.

According to another aspect, the present invention comprises a chemical vapor deposition reactor comprising a chamber and a rotatable wafer carrier disposed within the chamber, the wafer carrier being configured so as to enhance outward flow of reaction gas within the chamber.

According to another aspect, the present invention comprises a chemical vapor deposition reactor comprising a rotatable wafer carrier and a reaction chamber, a bottom of the reaction chamber being substantially defined by the wafer carrier.

According to another aspect, the present invention comprises a chemical vapor deposition reactor comprising a chamber, a wafer carrier disposed within the chamber, and a heater disposed outside of the chamber, the heater being configured to heat the wafer carrier.

According to another aspect, the present invention comprises a chemical vapor deposition reactor comprising a plurality of chambers and at least one of a common reactant gas supply system and a common gas exhaust system.

According to another aspect, the present invention comprises a chemical vapor deposition reactor comprising a wafer carrier configured such that reactant gas does not flow substantially below the wafer carrier.

According to another aspect, the present invention comprises a chemical vapor deposition reactor comprising a chamber, a wafer carrier, a gas inlet located generally centrally within the chamber, and at least one gas outlet formed in the chamber entirely above an upper surface of the wafer carrier so as to enhance laminar gas flow through the chamber.

According to another aspect, the present invention comprises a chemical vapor deposition reactor comprising a plurality of injectors configured so as to mitigate depletion. More particularly, a chemical vapor deposition reactor comprises a wafer carrier which cooperates with a chamber of the reactor to facilitate laminar flow of reaction gas within the chamber and also comprises a plurality of injectors configured so as to mitigate depletion.

The chemical vapor deposition reactor can comprise an inlet disposed proximate a central portion thereof. The injectors can comprise group III injectors. The inlet can comprise a group V inlet.

The injectors can define a plurality of zones and each zone can have a dedicated flow controller. For example, the injectors can define three zones, the injectors of each zone having a dedicated flow controller.

The flow through each zone can be individually controllable. Additionally, the flow through each injector can optionally be individually controllable. Further, the reactant concentration through each zone can be individually controllable. Additionally, the reactant concentration through each injector can optionally be individually controllable.

According to another aspect, the present invention comprises a method for chemical vapor deposition comprising injecting reactant gas into a reactor chamber in a manner that mitigates depletion. More particularly, the method can comprise rotating a wafer carrier within a chamber of a reactor, the wafer carrier cooperating with the chamber to facilitate laminar flow of reaction gas within the chamber; and injecting a gas reactant into the chamber via plurality of injectors configured so as to mitigate depletion.

Gas, such as a group V reactant, e.g., $NH_3$, can be added to the chamber via an inlet disposed proximate a central portion thereof. The gas injected into the chamber via the injectors can comprise group III reactants.

The gas flow through groups of controllers (such as corresponding to the zones) can be controlled. The flow can be controlled based upon which one of a plurality of zones the injectors are located within.

Thus, according to one aspect, the present invention comprises a lid for a chemical vapor deposition reactor, wherein the lid comprises or is configured to comprise a plurality of injectors.

These, as well as other advantages of the present invention, will be more apparent from the following description and drawings. It is understood that changes in the specific structure shown and described may be made within the scope of the claims, without departing from the spirit of the invention.

BRIEF DESCRIPTION OF THE DRAWINGS

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1:
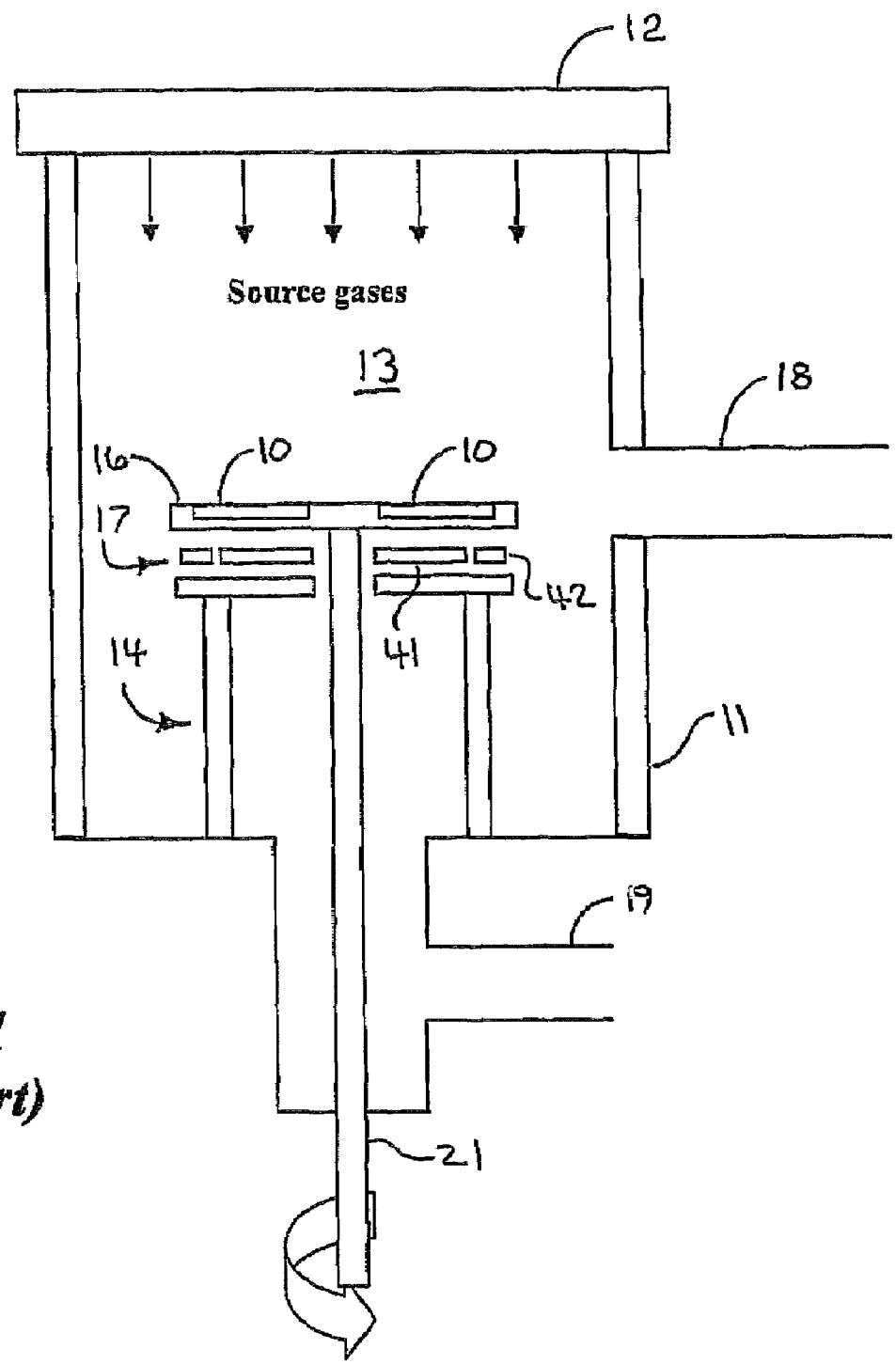
FIG. 1 is a semi-schematic cross-sectional side view of a contemporary reactor showing reaction gas being introduced thereinto in a dispersed fashion via a flow flange and showing the gas being exhausted from the chamber via a gas outlet disposed below the wafer carrier.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

Thus, the detailed description set forth below in connection with the appended drawings is intended as a description of the presently preferred embodiment(s) of the invention and is not intended to represent the only form(s) in which the present invention may be constructed or utilized. The description sets forth the functions and the sequence of steps for constructing and operating the invention in connection with the illustrated embodiment(s). It is to be understood, however, that the same or equivalent functions may be accomplished by different embodiments that are also intended to be encompassed within the spirit of the invention.

According to one aspect, the present invention comprises a chemical vapor deposition reactor comprising a rotatable wafer carrier which cooperates with a chamber of the reactor to facilitate laminar flow of reaction gas within the chamber.

According to one aspect, the present invention comprises a chemical vapor deposition reactor comprising a rotatable wafer carrier which is sealed at a periphery thereof to a chamber of the reactor such that laminar flow within the chamber is facilitated.

According to one aspect, the present invention comprises a chemical vapor deposition reactor comprising a chamber and a rotatable wafer carrier disposed within the chamber, the wafer carrier being configured so as to enhance outward flow of reaction gas within the chamber.

According to one aspect, the present invention comprises a chemical vapor deposition reactor comprising a rotatable wafer carrier and a reaction chamber, a bottom of the reaction chamber being substantially defined by the wafer carrier.

According to one aspect, the present invention comprises a chemical vapor deposition reactor comprising a chamber, a wafer carrier disposed within the chamber, and a heater disposed outside of the chamber, the heater being configured to heat the wafer carrier.

According to one aspect, the present invention comprises a chemical vapor deposition reactor comprising a plurality of chambers and at least one of a common reactant gas supply system and a common gas exhaust system.

According to one aspect, the present invention comprises a chemical vapor deposition reactor comprising a wafer carrier configured such that reactant gas does not flow substantially below the wafer carrier.

According to one aspect, the present invention comprises a chemical vapor deposition reactor comprising a chamber, a wafer carrier, a gas inlet located generally centrally within the chamber, and at least one gas outlet formed in the chamber entirely above an upper surface of the wafer carrier so as to enhance laminar gas flow through the chamber.

According to one aspect, the present invention comprises a chemical vapor deposition reactor comprising a chamber, a wafer carrier disposed within the chamber and cooperating with a portion (for example, the top) of the chamber to define a flow channel, and a shaft for rotating the wafer carrier. A distance between the wafer carrier and the portion of the chamber is small enough to effect generally laminar flow of gas through the flow channel.

Preferably, the distance between the wafer carrier and the portion of the chamber is small enough for centrifugal force caused by rotation of the wafer carrier to effect outward movement of gas within the channel. Preferably, the distance between the wafer carrier and the portion of the chamber is small enough that a substantial portion of the reactants in the reaction gas contact a surface of a wafer prior to exiting the chamber. Preferably, the distance between the wafer carrier and the portion of the chamber is small enough that most of the reactants in the reaction gas contact a surface of a wafer prior to exiting the chamber. Preferably, the distance between the wafer carrier and the portion of the chamber is small enough to mitigate thermal convection intermediate the chamber and the wafer carrier.

Preferably, the distance between the wafer carrier and the portion of the chamber is less than approximately 2 inches.

Preferably, the distance between the wafer carrier and the portion of the chamber is between approximately 0.5 inch and approximately 1.5 inches. Preferably, the distance between the wafer carrier and the portion of the chamber is approximately 0.75 inch.

Preferably, a gas inlet formed above the wafer carrier and generally centrally with respect thereto.

Preferably, the chamber is defined by a cylinder. Preferably, the chamber is defined by a cylinder having one generally flat wall thereof defining a top of the chamber and the reaction gas inlet in located at approximately a center of the top of the chamber. However, those skilled in the art will appreciate that the chamber may alternatively be defined by any other desired geometric shape. For example, the chamber may alternatively be defined by a cube, a box, a sphere, or an ellipsoid.

Preferably, the chemical vapor the wafer carrier is configured to rotate about an axis thereof and the reaction gas inlet is disposed generally coaxially with respect to the axis of the wafer carrier.

Preferably, the reaction gas inlet has a diameter which is less that 1/5 of a diameter of the chamber. Preferably, the reaction gas inlet has a diameter which is less than approximately 2 inches. Preferably, the reaction gas inlet has a diameter which is between approximately 0.25 inch and approximately 1.5 inch.

Thus, the reaction gas inlet is sized so as to cause reaction gas to flow generally from a center of the wafer carrier to a periphery thereof in a manner that results in substantially laminar reaction gas flow. In this manner convection currents are mitigated and reaction efficiency is enhanced.

Preferably, the reaction gas is constrained to flow generally horizontally within the chamber. Preferably, the reaction gas is constrained to flow generally horizontally through the channel. Preferably, the reaction gas is caused to flow outwardly at least partially by a rotating wafer carrier.

Preferably, the at least one reaction gas outlet formed in the chamber above a wafer carrier. Preferably, a plurality of reaction gas outlets is formed in the chamber entirely above the upper surface of the wafer carrier. Increasing the number of reaction gas outlet(s) enhances laminar flow of the reaction gas, particularly at the periphery of the wafer carrier, by facilitating radial flow of the reaction gas (by providing more straight line paths for gas flow from the center of the wafer carrier to the periphery thereof). Forming the reaction gas outlets entirely above the upper surface of the wafer carrier mitigates undesirable turbulence in the reaction gas flow resulting from the reaction gas flowing over an edge of the wafer carrier.

Thus, at least one reaction gas outlet is preferably formed in the chamber above a wafer carrier and below a top of the chamber.

The chemical vapor deposition reactor preferably comprises a reaction gas inlet formed generally centrally within the chamber and at least one reaction gas outlet formed in the chamber. The wafer carrier is disposed within the chamber below the gas outlet(s) so as to define a flow channel intermediate a top of the chamber and the wafer carrier such that reaction gas flows into the chamber through the reaction gas inlet, through the chamber via the flow channel, and out of the chamber via the reaction gas outlet.

A ring diffuser is preferably disposed proximate a periphery of the wafer carrier and configured so as to enhance laminar flow from the reaction gas inlet to the reaction gas outlet. The wafer carrier is disposed within the chamber below the gas outlets so as to define a flow channel intermediate a top of the chamber and the wafer carrier such that reaction gas flows into the chamber through the reaction gas inlet, through the chamber via the flow channel, and out of the chamber via the reaction gas outlet.

The ring diffuser preferably comprises a substantially hollow annulus having an inner surface and an outer surface, a plurality of openings formed in the inner surface, and a plurality of openings form in the outer surface. The openings in the inner surface enhance uniformity of reaction gas flow over the wafer carrier.

The openings in the inner surface are preferably configured so as to create enough restriction to reaction gas flow therethrough so as to enhance a uniformity of reaction gas flow over the wafer carrier.

The ring diffuser is preferably comprised of a material which is resistant to deterioration caused by heated ammonia. For example, the ring diffuser may be formed of SiC coated graphite, SiC, quartz, or molybdenum.

According to one aspect of the present invention, a ring seal is disposed intermediate the wafer carrier and the chamber. The ring seal is configured to mitigate reaction gas flow out of the chamber other than from the reaction gas outlet. The ring seal preferably comprises either graphite, quartz, or SiC.

According to one aspect of the present invention, a heater assembly is disposed outside of the chamber and proximate the wafer carrier. The heater may be an induction heater, a radiant heater, or any other desired type of heater. Preferably, a heater purge system is configured to mitigate contact of reaction gas with the heater.

Typically, a gas flow controller is configured to control the amount of reactant gases introduced into the chamber via the gas inlet port.

The wafer carrier is preferably configured to support at least three 2 inch round wafers. However, the wafer carrier may alternatively be configured so as to support any desired number of wafers, any desired size of wafers, and any desired shape of wafers.

According to one aspect of the present invention, the wafer carrier is configured so as to facilitate outward flow of reaction gas due to centrifugal force. Thus, the wafer carrier preferably comprises a rotating wafer carrier. The wafer carrier is preferably configured to rotate at greater than approximately 500 rpm. The wafer carrier is configured to rotate at between approximately 100 rpm and approximately 1500 rpm. The wafer carrier is preferably configured to rotate at approximately 800 rpm.

The apparatus and method of the present invention may be used to form wafers, from which a variety of different semiconductor devices may be formed. For example, the wafers may be used to form die from which LEDs are fabricated.

The present invention is illustrated in FIGS. 1-10, which depict presently preferred embodiments thereof. The present invention relates to a chemical vapor deposition (CVD) reactor and an integrated multi-reactor system which is suitable for scaled up throughput. The reactor employs a geometry that substantially suppresses thermal convection, a gas injection scheme providing very high gas velocity to avoid adduct adhesion to surface, and a restricted growth zone to enhance growth efficiency (by reducing source gas consumption).

For high throughput configurations, multiple units of said reactor can be integrated. Each reactor in the multiple-unit configuration can be of a relatively small scale in size, so that the mechanical construction can be simple and reliable. All reactors share common gas delivery, exhaust and control systems so that cost is similar to the larger conventional reactor with the same throughput.

The throughput scaling up concept is independent with respect to reactor design and can also be applied to various other reactor designs. In theory, there is no limit in how many reactors can be integrated in one system. But as a practical matter, the maximum number of reactors integrated is substantially limited by how the gas delivery system is configured. Both reactor design and the scaling up concept can also be applied to the growth of various different materials, and thus includes but is not limited to group III-nitride, all other group III-V compounds, oxides, nitrides, and group V epitaxy.

Figure 4:
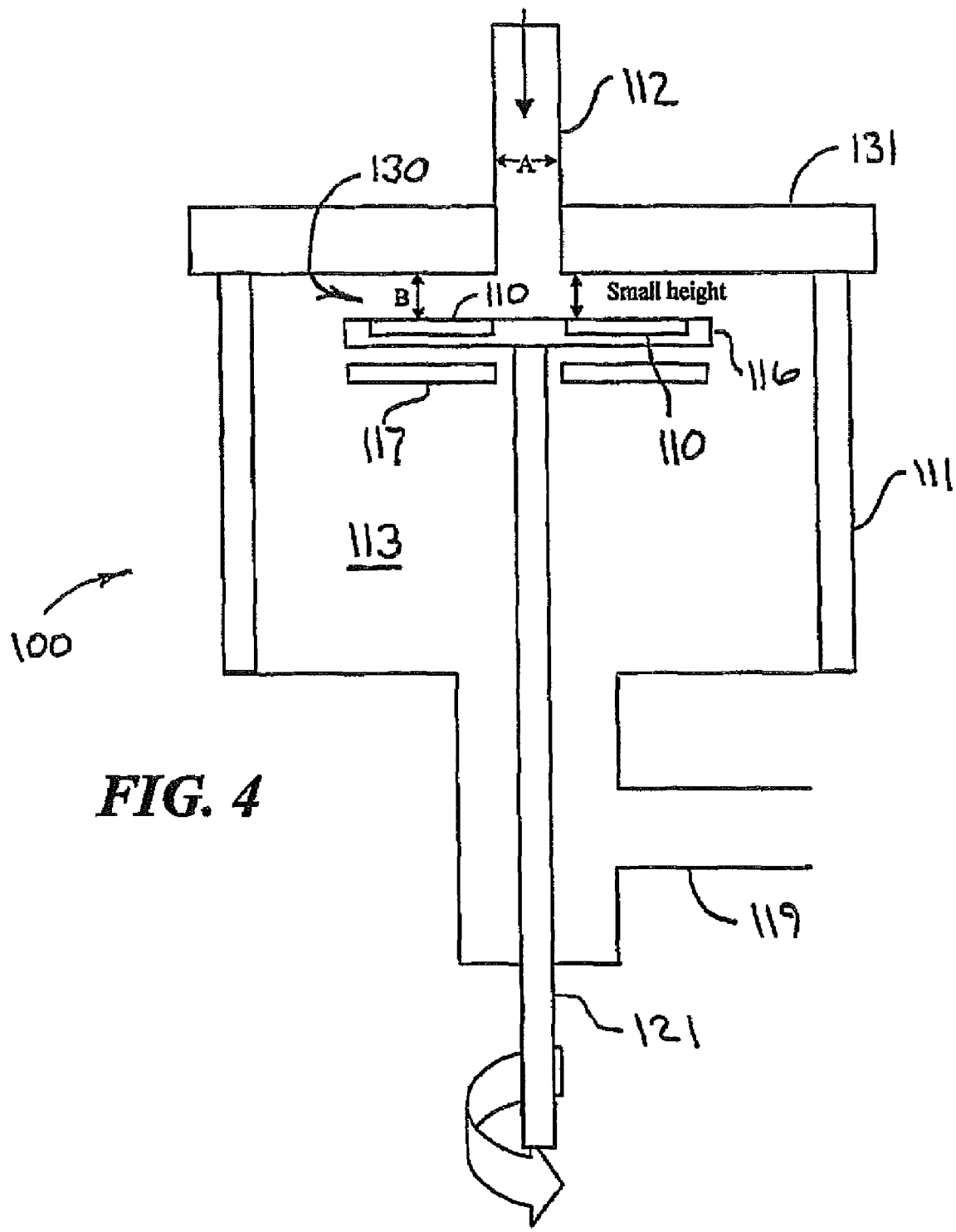
FIG. 4 is a semi-schematic cross-sectional side view of a reactor having a comparatively small distance between the top of the chamber and the wafer carrier and having a single comparatively small gas inlet disposed generally centrally with respect to the wafer carrier according to the present invention.

Referring now to FIG. 4, a reactor 100 has a narrow gas inlet 112 located at the top and center of the reactor cylinder 111. The cylinder 111 is double walled and water cooled, like the reactor shown in FIG. 1. The temperature of the water can be varied so as to control the temperature of the chamber 113. A narrow gas channel 130 defined by the wafer carrier 116 and the top 131 of the reactor 100 directs gas outwardly.

Pockets formed in the wafer carrier 116 are configured to receive and support wafers 110, such as 2 inch wafers suitable for use in the fabrication of LEDs.

The rotating wafer carrier 116 assists gas flow outwardly by its centrifugal force. The rotating wafer carrier 116 preferably rotates at between 10 and 1500 rpm. As those skilled in the art will appreciate, higher rotational speeds of the wafer carrier 116 typically result in greater centrifugal force being applied to the reaction gas.

By introducing the gas from the center, the gas is forced to flow generally horizontally in the narrow channel 130, making the growth process somewhat simulate a horizontal reactor. As those skilled in the art will appreciate, one advantage of a horizontal reactor is its higher growth efficiency. This is because all the reactants in a horizontal reactor are restricted to a much narrower volume, thus making the reactants more efficient in their contact with the growing surface.

Preferably, the reaction gas inlet has a diameter, dimension A, which is less that ⅕ of a diameter of the chamber. Preferably, the reaction gas inlet has a diameter which is less than approximately 2 inches. Preferably, the reaction gas inlet has a diameter which is between approximately 0.25 inch and approximately 1.5 inch.

Figure 2:
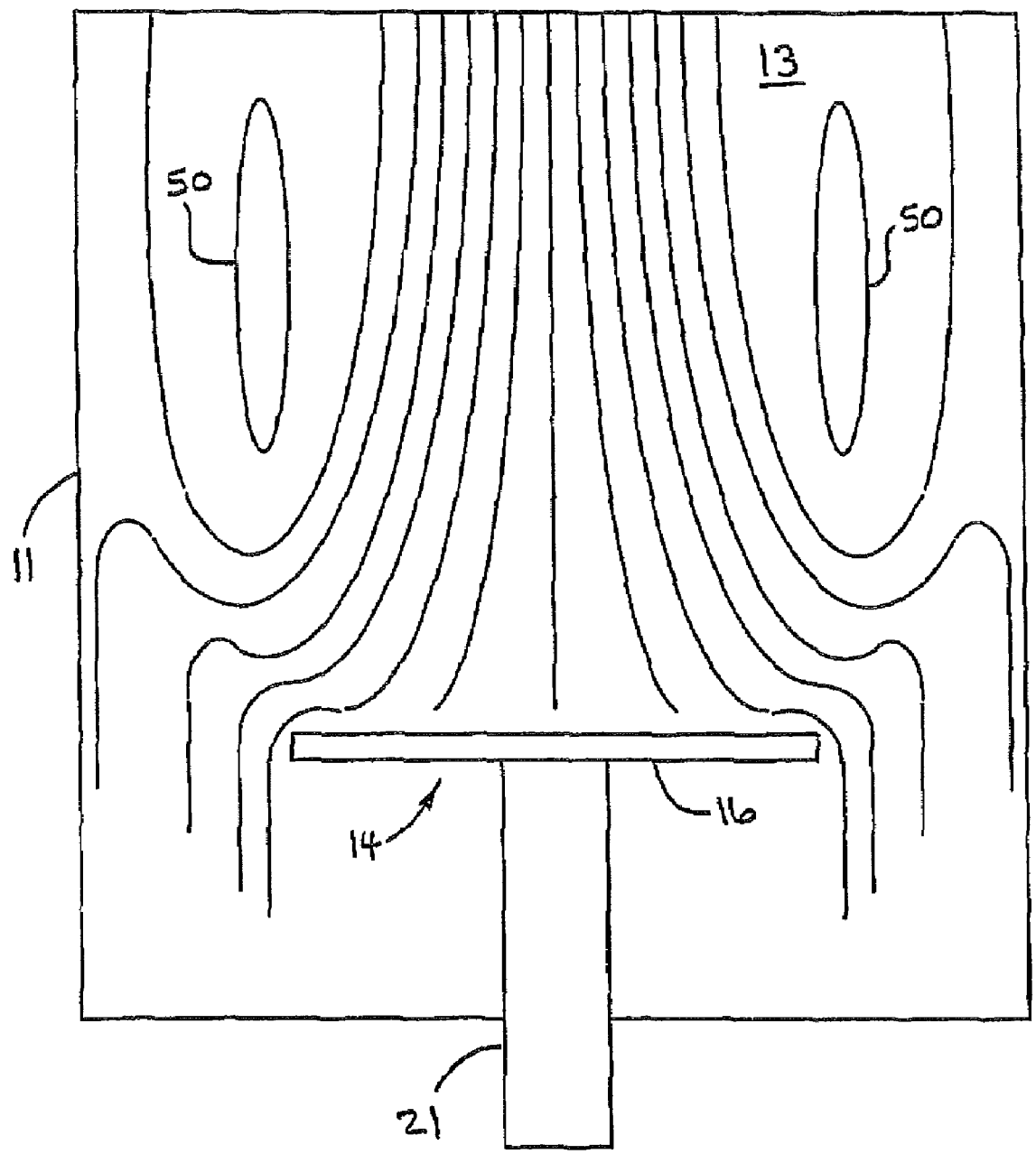
FIG. 2 is a semi-schematic cross-sectional side view of a contemporary reactor showing undesirable convection caused re-circulation of reaction gas within the chamber, wherein the re-circulation is facilitated by the comparatively large distance between the top of the chamber and the wafer carrier.
Figure 3A:
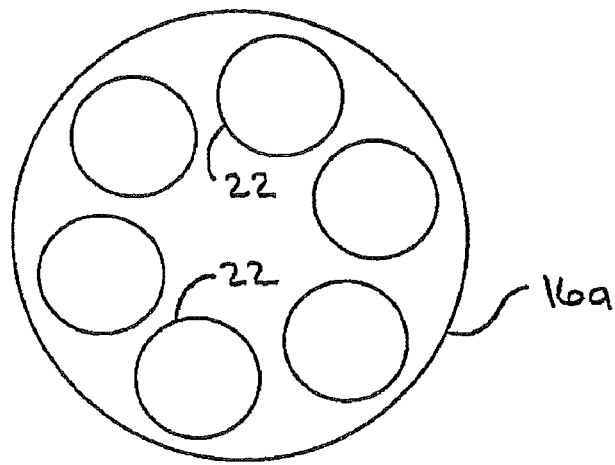
FIG. 3A is a semi-schematic top view of a wafer carrier which is configured so as to support six wafers within a reactor.
Figure 3B:
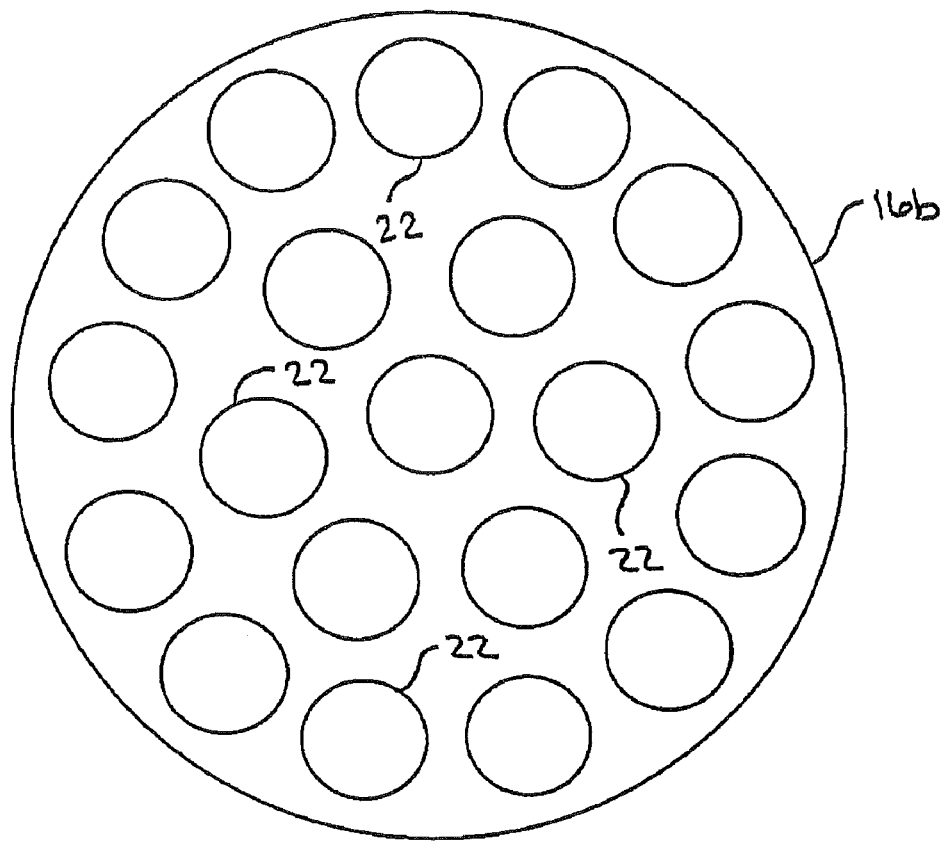
FIG. 3B is a semi-schematic top view of a wafer carrier which is configured so as to support twenty wafers within a reactor.

Unlike the use of additional gas flow to suppress thermal convection in the vertical type of reactor such as the RDR as shown in FIG. 2, the suppression of thermal convection is accomplished by using the narrow flow channel 130, so that gas flow is forced in the desired direction.

The distance between the upper surface of the wafer carrier 116 and the top of the chamber 111 is designated as dimension B. Dimension B is preferably less than approximately 2 inch. Dimension B is preferably between approximately 0.5 inch and approximately 1.5 inch. Dimension B is preferably approximately 0.75 inch.

As discussed above, the depletion effect is one major drawback in horizontal reactors. As reactants in the carrier gas proceed from the center toward the peripheral of the rotating disk, a substantial amount of the reactants is consumed along the way, making the thin film deposited thinner and thinner along the radial direction upon the wafer.

According to the present invention, growth efficiency is improved by using a comparatively high wafer carrier rotation rate, so that the centrifugal force generated by the rotation of the wafer carrier enhances the gas speed over the wafers without using higher gas flow rate.

Figure 5:
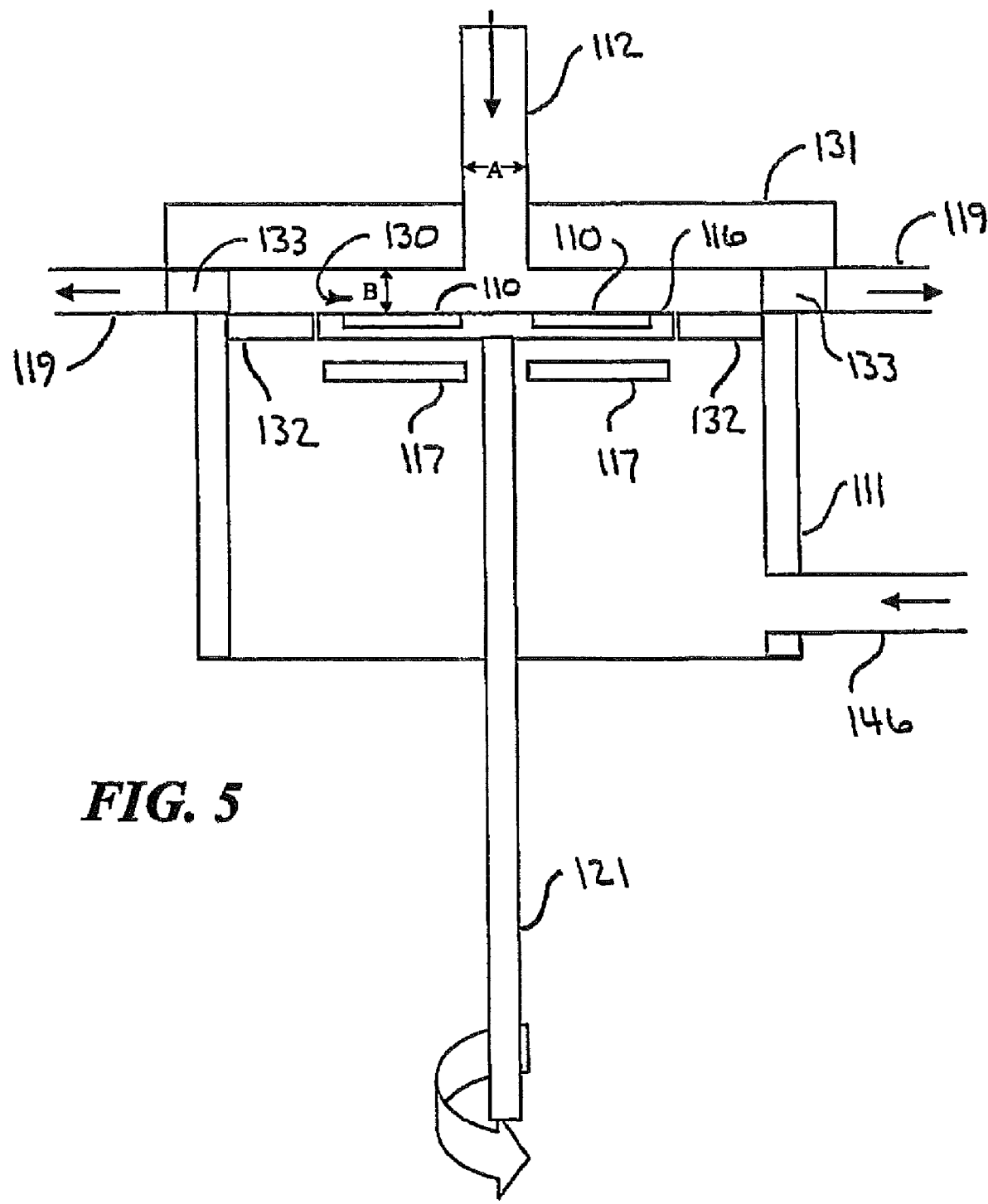
FIG. 5 is a semi-schematic cross-sectional side view of an alternative configuration of the reactor of FIG. 4, having a plurality of reaction gas outlets disposed entirely above the upper surface of the wafer carrier and in fluid communication with a ring diffuser so as to enhance laminar gas flow, having a seal disposed between the wafer carrier and the chamber, and having a heater disposed outside of the chamber along with a heater gas purge so as to mitigate the effects of reactant gas upon the heater, according to the present invention.

Referring now to FIG. 5, gas flow resistance can be reduced, so that a higher degree of laminar flow is produced, by forming the reaction gas outlet(s) such that they are entirely above the upper surface of the wafer carrier. By forming the gas outlet entirely above the upper surface of the wafer carrier 116, a more direct route (and thus less con-torted) for the reaction gas from the gas inlet 112 to the gas outlet 119 is provided. As those skilled in the art will appreciate, the more direct and the less contorted the route of the reaction gas, the less turbulent (and more laminar) its flow will be.

By adding a ring seal 132 around the rotating wafer carrier 116 to bridge the flow channel 130 of the exhaust gas flow, flow resistance is reduced and laminar flow substantially enhanced. This is because a change of gas flow direction at the wafer carrier's edge is eliminated. The ring seal 132 can be made of quartz, graphite, SiC or other durable materials for suitable for the reactor's environment.

In order to achieve even pumping of exhaust gas (and thus more laminar flow), a ring shaped diffuser 133 (better shown in FIGS. 6A and 6B) can be used. The ring shaped diffuser 133 effectively makes almost the entire periphery of the reactor, proximate the periphery of the wafer carrier 132, one generally continuous gas outlet port.

A heater 117 is disposed outside of the chamber (which is that portion of the reactor within which reaction gas readily flows). The heater is disposed beneath the wafer carrier 116. Since the ring seal 132 mitigates reaction gas flow beneath the wafer carrier 116, the heater is not substantially exposed to reaction gas and thus is not substantially degraded thereby.

Preferably, a heater purge 146 is provided so as to purge any reaction gas that leaks past the ring seal 132 into the area beneath the wafer carrier.

Figure 6A:
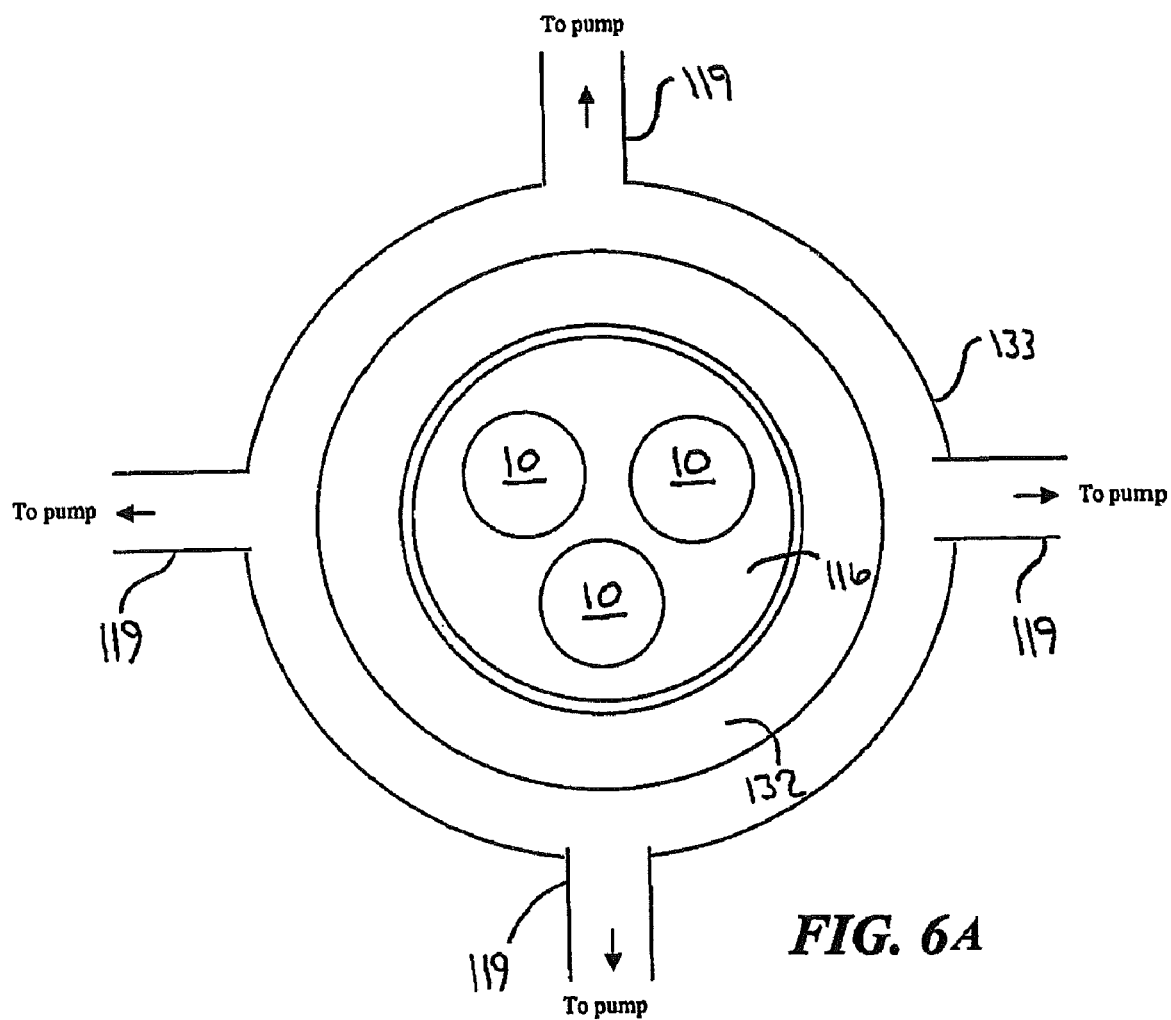
FIG. 6A is a semi-schematic cross-sectional top view of the reactor of FIG. 5, showing a three pocket wafer carrier, the seal between the wafer carrier and the chamber, the diffuser, and the reaction gas outlets.

Referring now to FIG. 6A, four pumping ports or gas outlets 119 are in fluid communication with the diffuser 133. All of the gas outlets 119 are preferably connected to a common pump.

The ring seal 132 bridges the gap between the wafer carrier 116 and the chamber 111, so as to facilitate laminar flow of reaction gas, as discussed above.

Figure 6B:
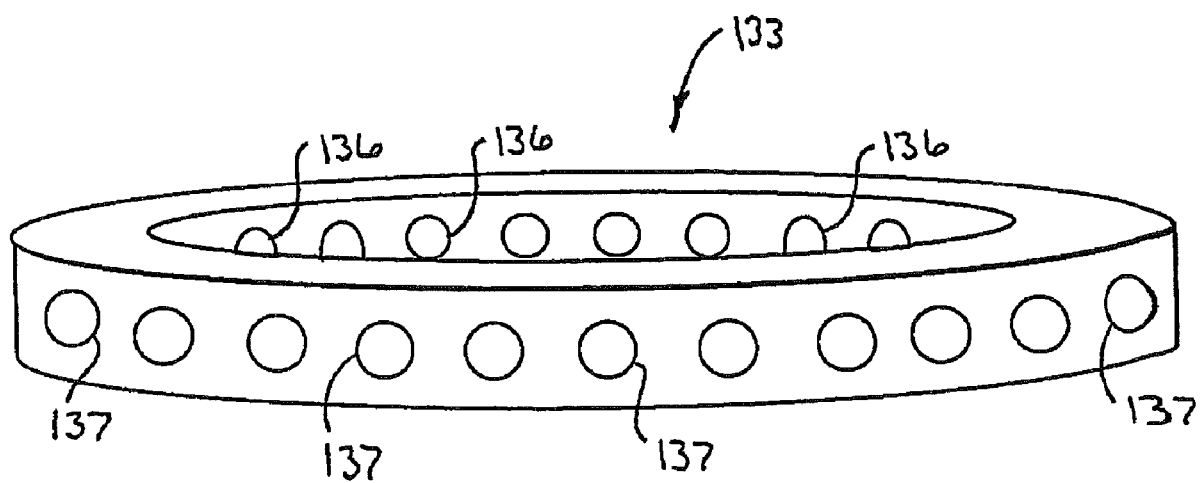
FIG. 6B is a semi-schematic perspective side view of the diffuser of FIGS. 5 and 6A showing a plurality of apertures formed in the inner surface and the outer surface thereof.

Referring now to FIG. 6B, the diffuser 133 comprises a plurality of inner apertures 136 and a plurality of outer apertures 137. As those skilled in the art will appreciate, the greater the number of inner apertures 136 that there are, the more nearly the inner apertures approximate a single continuous opening. Of course, the more nearly the inner apertures approximate a single continuous opening, the more laminar the gas flow through the chamber.

The diffuser 133 preferably comprises at least as many outer apertures as there are gas outlet ports (there are, for example, four gas outlet ports 119 shown in FIG. 5A).

The diffuser 133 is preferably made of graphite, SiC coated graphite, solid SiC, quartz, molybdenum, or other material that resist hot ammonia. Those skilled in the art will appreciate that various materials are suitable.

The size of the holes in the diffuser 133 can be made small enough to create slight restriction to the gas flow so that more even distribution to the exhaust can be achieve. However, the hole size should not be made so small that clogging is likely to occur, since reaction product contains vapor and solid particulate that may adhere to or condense upon the diffuser holes.

Figure 7:
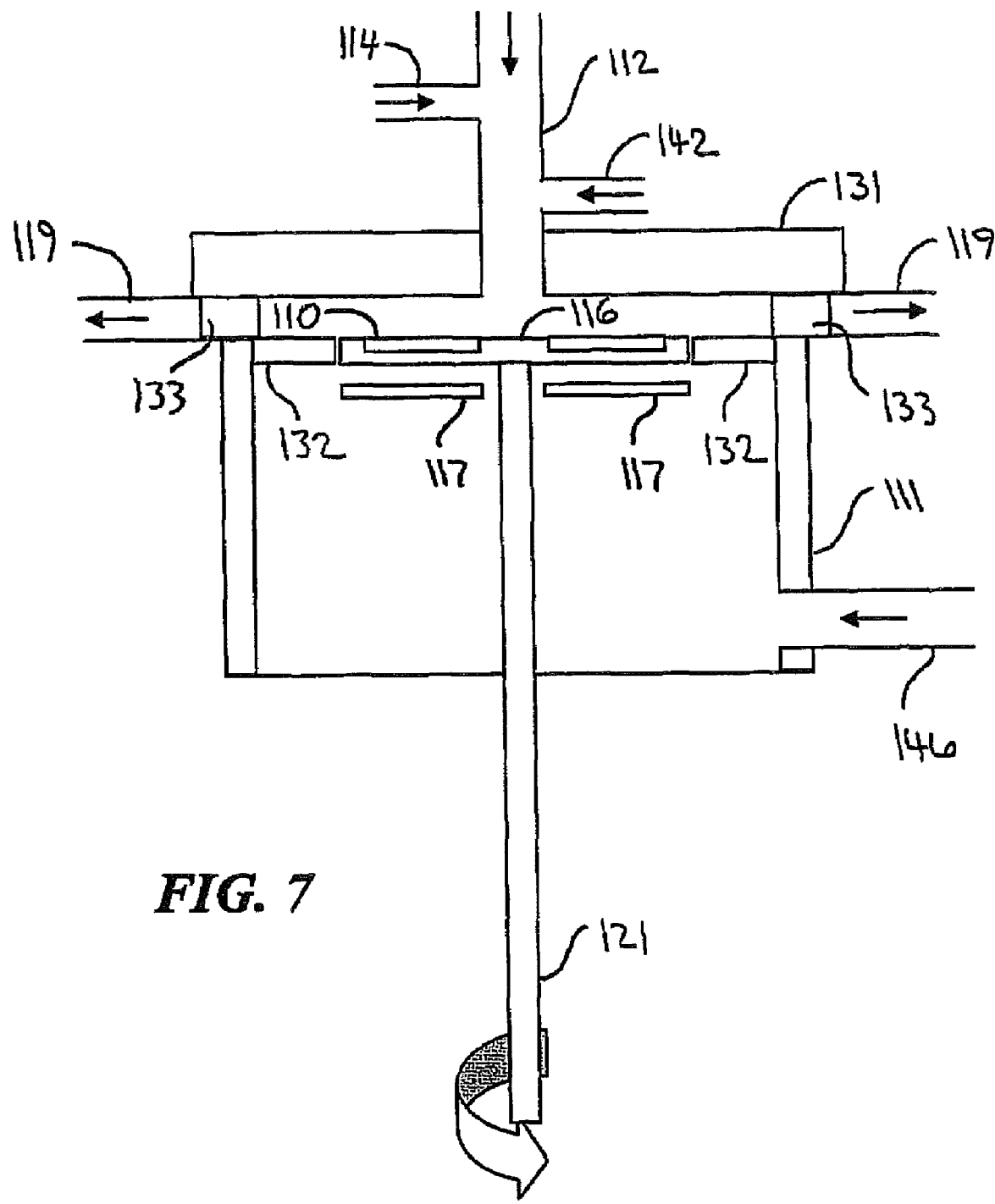
FIG. 7 is a semi-schematic cross-sectional side view of an alternative configuration of the reactor of FIG. 5, having a separate alkyl inlet and a separate ammonia inlet providing reaction gas to a carrier gas.
Figure 8:
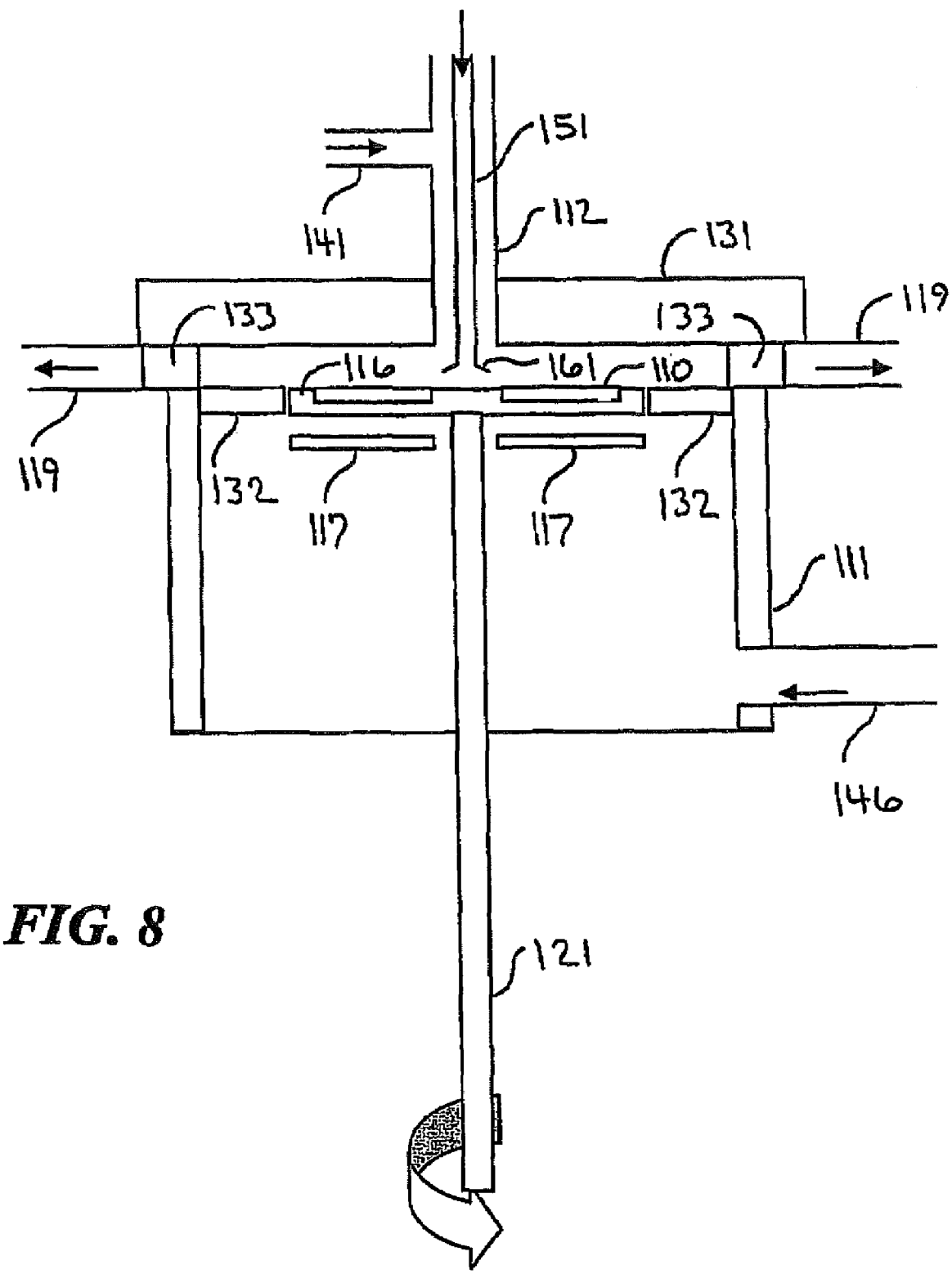
FIG. 8 is a semi-schematic cross-sectional side view of an alternative configuration of the reactor of FIG. 5, having an ammonia inlet disposed generally concentrically within an alkyl/carrier gas inlet.

Referring now to FIGS. 7 and 8, the reactant gas injection configuration can be modified to improve gas phase reaction. According to these modified configurations, alkyls and ammonia are mostly separated before being introduced into the reaction chamber as shown in FIG. 7, and are completely separated before entering the reaction chamber as shown in FIG. 8. In both cases, the reactants are mixed immediately before reaching the growth zone where wafers are located. Gas phase reaction only happens in a very short time before gases participate in the growth process.

With particular reference to FIG. 7, an alkyl inlet 141 is separate from an ammonia inlet 142. Both the alkyl inlet 141 and the ammonia inlet 142 provide a reaction gas to the carrier gas inlet 112 immediately prior to these gases entering the chamber 111.

With particular reference to FIG. 8, the alkyl inlet 141 provides a reaction gas to the carrier inlet 112 much the same as in FIG. 7. The ammonia inlet 151 comprises a tube disposed within the carrier inlet 112. The ammonia inlet is preferably disposed generally concentrically within the carrier inlet 112. However, those skilled in the art will appreciate that various other configurations of the alkyl inlet 141, the ammonia inlet 151, and the carrier inlet 112 are likewise suitable.

A nozzle 161 tends to spread ammonia evenly across the wafer carrier 116 so as to provide enhance reaction efficiency.

The reaction gas inlet configurations of both FIG. 7 and FIG. 8 mitigate undesirable gas phase reactions prior to the reaction gases contacting the wafers.

As mentioned above, an advantage of the reactor configuration shown in FIGS. 5, 7, and 8 is the significant reduction of undesirable deposits upon the heater 117. The heater assembly can be either a radiant heater or a radio frequency (RF) inductive heater. By providing a heater purge 146 to the lower part of the reactor 111, reaction gas can be effectively prevented from entering the heater region. Thus, any reaction gas leaks past the ring seal 132 is quickly purged from the heater region, such that deterioration of the heater 117 caused thereby is mitigated.

According to one aspect, the present invention comprises a way to scale up the throughput of a metal organic chemical vapor deposition (MOCVD) system or the like. Unlike contemporary attempts to scale up a MOCVD reactor by increasing the size of the reaction chamber, present invention integrates several smaller reactor modules to achieve the same wafer throughput.

Figure 9:
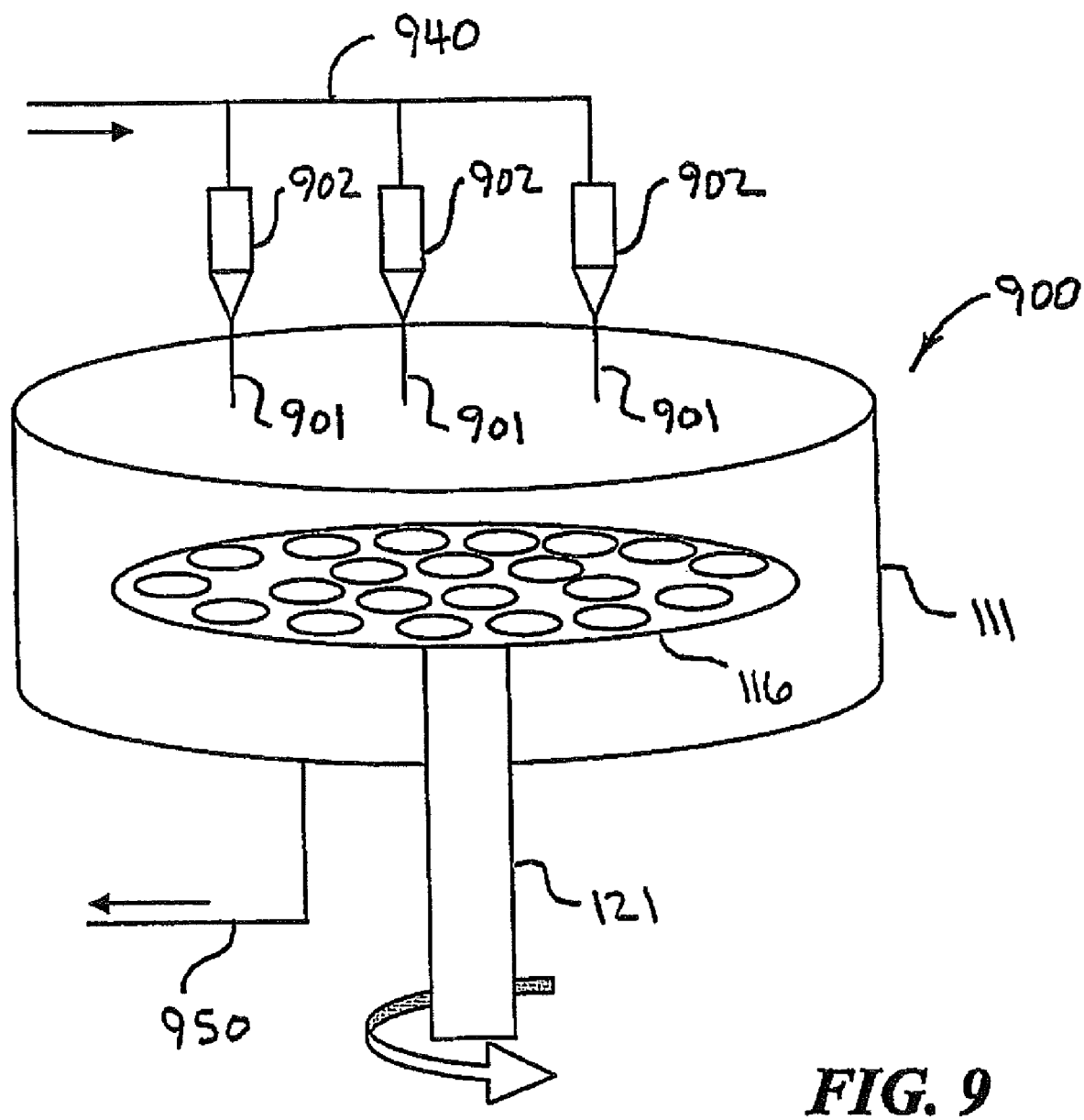
FIG. 9 is a semi-schematic perspective side view of a comparatively large, scaled up RDR reactor having a twenty-one wafer capacity and having a plurality of reaction gas inlets.

Referring now to FIG. 9, a twenty-one wafer reactor 900 is shown. Because of the large size of the reactor 900, gas is usually introduced through multiple ports 901-903 so as to provide even distribution thereof. Gas flow controllers 902 facilitate control of the amount of reaction gas and the amounts of the components of the reaction gas provided to the chambers.

A gas supply system 940 provides reaction gas to the ports 901-903. A gas exhaust system 950 removes the spent reaction gas from the reactor 111.

Figure 10:
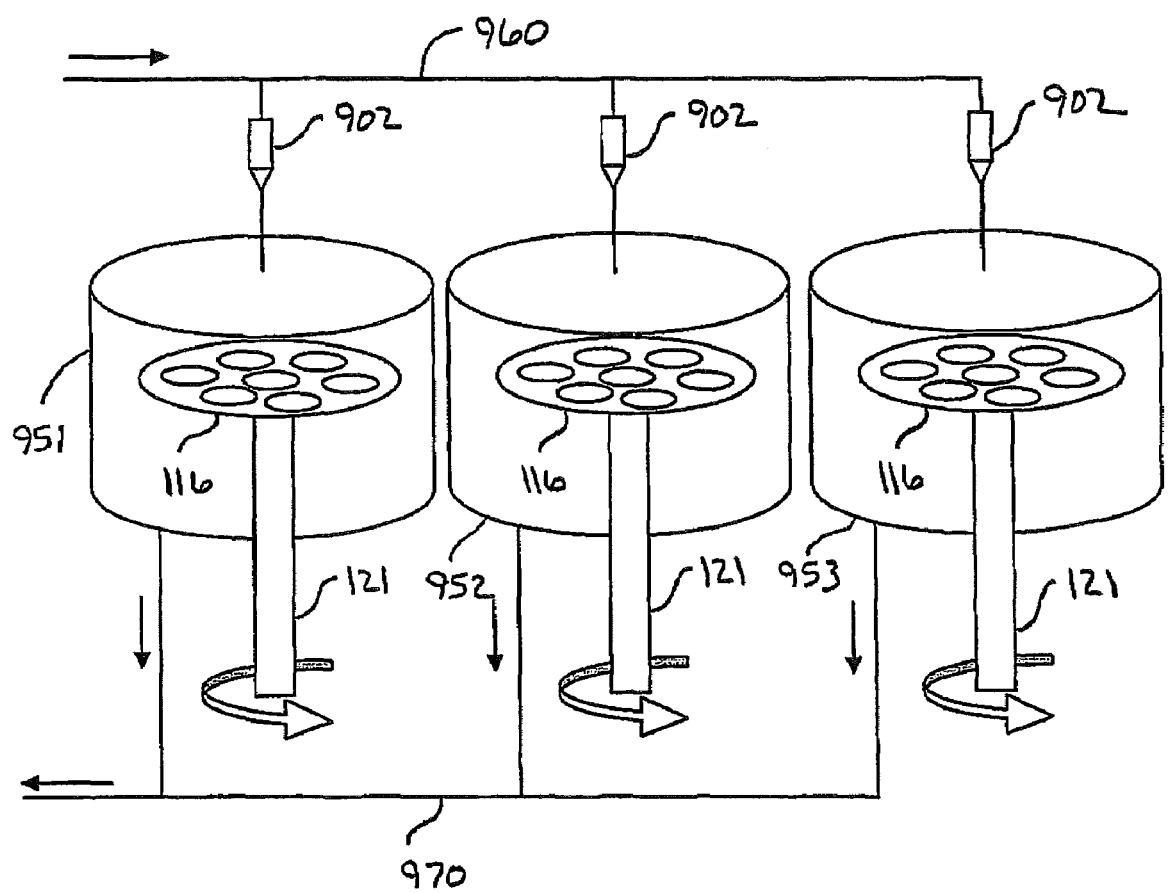
FIG. 10 is a semi-schematic perspective side view of a reactor system having three comparatively small reactors (each of which has a seven wafer capacity such that the total capacity is equal to that of the comparative large reactor of FIG. 9) which share a common reaction gas supply system and a common reaction gas exhaust system.

Referring now to FIG. 10, an integrated three chamber reactor of the present invention is shown. Each chamber 951-953 is a comparatively small chamber, each defining, for example, a seven wafer reactor. All of the reactors share the same gas inlet system 960 and gas exhaust system 970.

Both the configuration of FIG. 9 and the configuration of FIG. 10 yield the same twenty-one wafer throughput. However, there are substantial advantages of the present invention, as shown in FIG. 10, as compared to the reactor as shown in FIG. 9. Smaller reactors have better hardware reliability, especially for group III nitride growth, since smaller mechanical parts have lower thermal stress at high temperatures.

Further, growth consistency is better achieved with smaller reactors, since temperature and flow dynamics are much easier to maintain than in larger reactors. Also, since construction of smaller reactor is much simpler than larger reactor, maintenance of smaller reactor is much easier and takes less time. Therefore, a smaller reactor usually has higher uptime, as well as less frequent and less expensive parts service.

All of these factors result in much lower cost of ownership for small reactors, since real wafer yield is higher and maintenance cost is lower. Since the cost to build a reactor is only about 2-5% of a whole MOCVD system, adding multiple reactors in the system does not increase overall cost appreciably. The benefit of this invention is much greater than the cost of additional reactors.

As discussed in detail above, the present invention comprises a chemical vapor deposition reaction chamber having a rotatable wafer carrier, a narrow flow channel, a gas inlet located at the center of the top lid, a gas exit above the wafer carrier, a sealing ring around the wafer carrier to facilitate flow laminarly to the exhaust and to define a heater chamber.

During the growth process (deposition), the wafer carrier is rotating, typically at hundreds of rpm, e.g., 500-1500 rpm, so as to facilitate faster gas flow in the flow channel via the use of centrifugal force. Reactants mixed with less reactive gases, such as nitrogen or hydrogen (carrier gases), are carried into the flow channel and result in deposition on the hot substrates.

However, a portion of the chemical reaction occurs sooner that desirable as the gas travels though the channel and a substantial portion, possibly most, of the reactants in the gas are consumed close to the gas inlet. A diminishing amount of the source gas is left as gas travels along the channel. This is known as depletion effect. The depletion effect is well known and commonly occurs in horizontal reactors, where gas travels from one end of the chamber horizontally to the other end of the chamber.

In the case of GaN growth, the reactants used can be trimethylgallium (TMG) and ammonia ($NH_3$), both of which can be carried by either hydrogen ($H_2$) or nitrogen ($N_2$). The supply of $NH_3$ is much greater than the supply of TMG in a typical metalorganic chemical vapor deposition (MOCVD) growth process for GaN in order to prevent decomposition of GaN at the surface. This is the case for III-V compounds and III-nitride growth using MOCVD where group V gas supply is much greater than group III. Therefore the depletion effect that adversely affects growth uniformity is mostly due to the depletion of group III sources.

Figure 11:
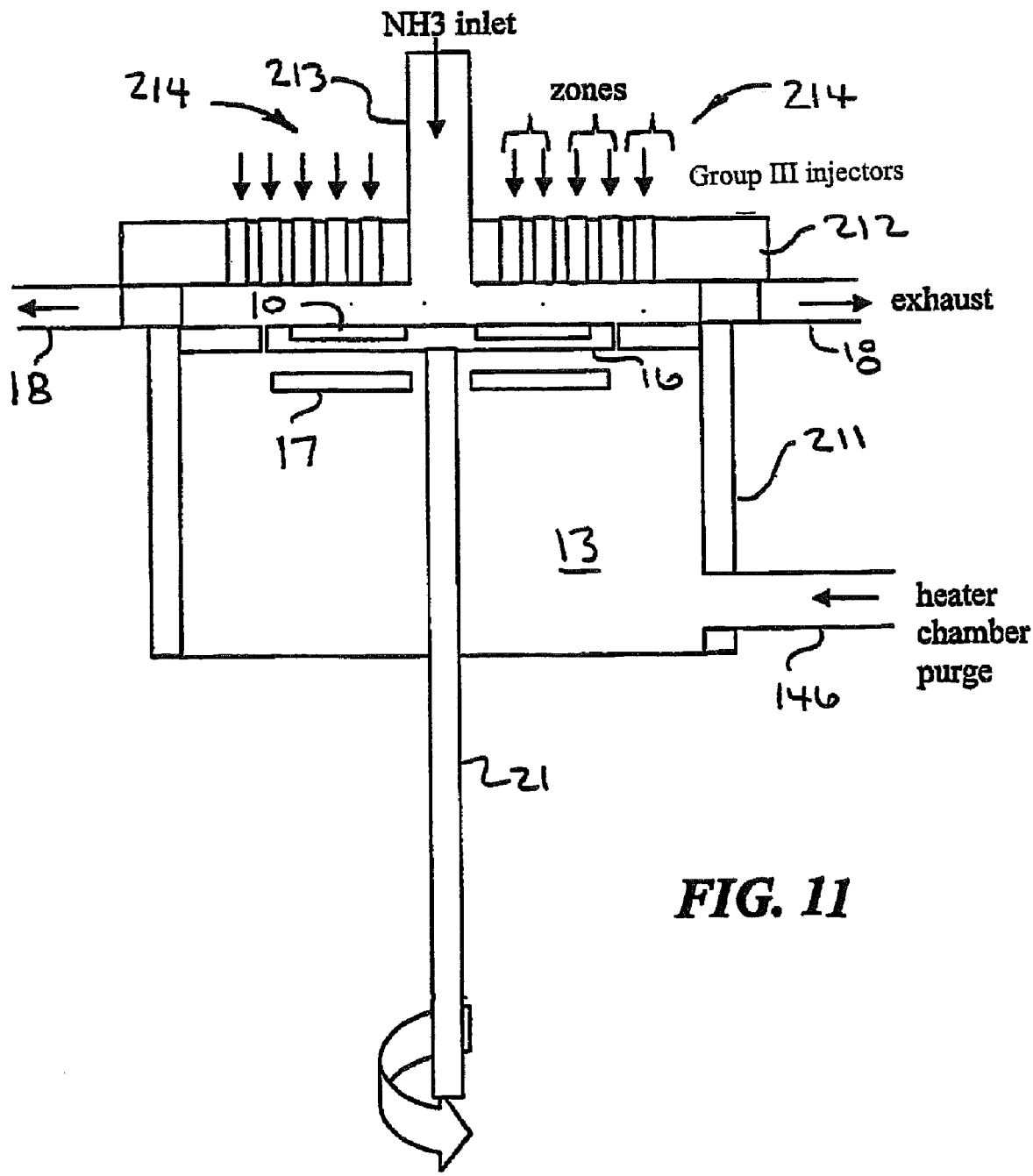
FIG. 11 is a semi-schematic, cross-sectional side view of a reactor having a plurality of gas inlets formed so as to define a plurality of zones.

Referring now to FIG. 11, according to at least one aspect of the present invention, the group III and group V gas inlets are separated. A top or lid 212 of a reactor 211 has an $NH_3$ inlet 213 formed generally centrally therein. A plurality of group III injectors 214 are formed in the lid in a manner that defines a plurality of zones (best seen in FIG. 12).

Figure 12:
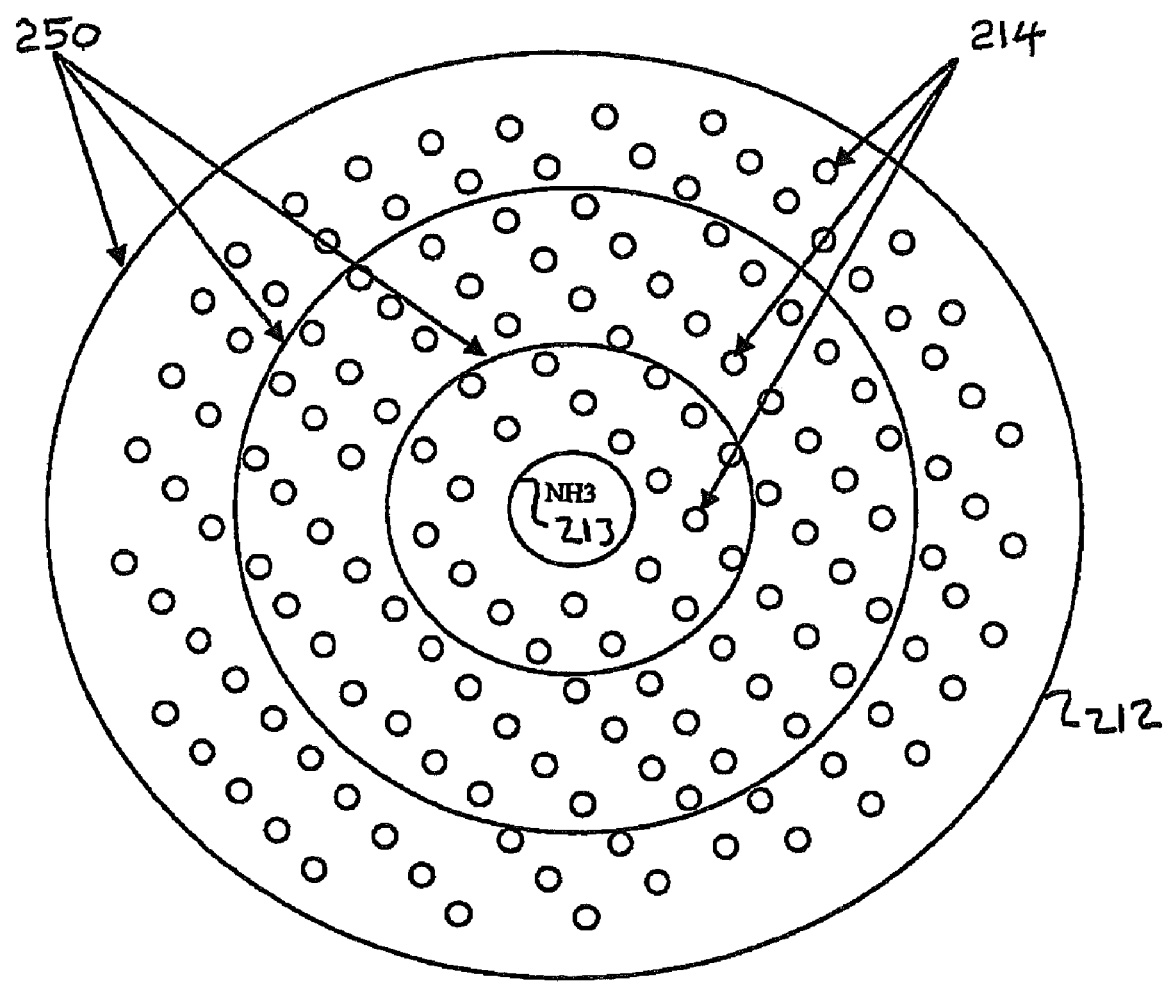
FIG. 12 is a semi-schematic top view of the lid of the reactor of FIG. 11, better showing how the plurality of gas inlets define a plurality of zones.

Referring now to FIG. 12, a plurality of separate zones 250 are defined by separate groupings of group III injectors 214. Each grouping of injectors 214 is positioned within a dedicated one of the zones 250. All of the injectors 214 of a given zone 250 can have common plumbing and the flow for each zone is separately controllable with respect to the flow through the injectors 214 of the other zones 250. That is, the amount of gas flowing into each zone can be controlled by a dedicated flow controller so that any desired group III gas (source) distribution can be adjusted flexibly. Either the same gases or different gases can flow through the injectors of each grouping 214. Thus, the flow rate for all of the injectors 214 can be approximately the same and the concentration of the group III reactants can be varied from zone to zone, for example.

Three zones 250 and consequently three groups of injectors 214 are shown in FIG. 12. However, those skilled in the art will appreciate that any desired number of zones 250 and any desired number of groups of injectors 214 can be provided. Each zone 250 can contain any desired number of injectors 214. Indeed, every single injector can define a zone and can be individually controlled with respect to what gases are injected therewith and the flow rate of injection. Thus, the configuration of zones 250 and injectors 214 shown in FIGS. 11 and 12 and discussed herein is by way of example only, and not by way of limitation.

The lid 212 can comprise any desired number of injectors 214. For example, the lid 212 can comprises 12, 24, 36, 48, 64, or more injectors 214. Further, each zone can contain any desired number of injectors 214. For example, each zone can contain 4, 6, 8, 12, or more injectors 214.

By keeping the group V gas inlet 213 at the center of the lid 212 and distributing the group III gas in a controlled manner over the entire lid 212, laminar flow is established by the group V gas while eliminating the depletion effect of group III source. Much better deposition uniformity over the entire wafer carrier can be achieved. The wafer carrier can rotate at a rate of between approximately 10 rpm and approximately 1500 rpm. The pressure in the reactor can be less than or equal to approximately 760 torr.

Distributing group III gas over the entire lid 212 can be achieved by creating holes (injectors) in the lid. Water cooling of the group III injectors can also provided to prevent premature decomposition of the group III sources.

It is understood that the exemplary method and apparatus for chemical vapor deposition described herein and shown in the drawings represents only presently preferred embodiments of the invention. Indeed, various modifications and additions may be made to such embodiments without departing from the spirit and scope of the invention. For example, it should be appreciated that the apparatus and method of the present invention may find applications which are different from metal organic chemical vapor deposition. Indeed, the present invention may be suitable for application completely unrelated to the fabrication of semiconductor devices.

Thus, these and other modifications and additions may be obvious to those skilled in the art and may be implemented to adapt the present invention for use in a variety of different applications.

The invention claimed is:

1. A method for chemical vapor deposition, the method comprising:
   rotating a wafer carrier which within a chamber of a reactor, the wafer carrier cooperating with the chamber to define a flow channel that is generally flat, continuous, and unobstructed, and wherein a distance between the wafer carrier and a portion of the chamber is small enough to effect generally laminar flow through the flow channel;
   adding a group V gas to the chamber via an inlet disposed proximate a central portion thereof; and
   injecting a group III gas reactant into the chamber via a plurality of injectors configured so that the group III gas reactant is distributed over an entire top of the chamber so as to mitigate depletion.

2. The method as recited in claim 1, further comprising controlling gas flow though groups of injectors, the flow being controlled based upon which one of a plurality of zones the injectors are located within.

3. The method as recited in claim 2, wherein the flow through each zone is individually controllable.

4. The method as recited in claim 2, wherein the reactant concentration through each zone is individually controllable.

5. The method as recited in claim 1, wherein the injectors define three zones, the injectors of each zone having a dedicated flow controller.

6. The method as recited in claim 1, wherein the flow through each injector is individually controllable.

7. The method as recited in claim 1, wherein the reactant concentration through each injector is individually controllable.

8. The method as recited in claim 1, wherein the wafer carrier rotates at a rate between approximately 10 rpm and approximately 1500 rpm.

* * * * *

UNITED STATES PATENT AND TRADEMARK OFFICE
CERTIFICATE OF CORRECTION

PATENT NO. : 7,641,939 B2 Page 1 of 1
APPLICATION NO. : 11/932293
DATED : January 5, 2010
INVENTOR(S) : Heng Liu It is certified that error appears in the above-identified patent and that said Letters Patent is hereby corrected as shown below:

In column 16, line 4, delete the word "which".

Signed and Sealed this

Twentieth Day of July, 2010

David J. Kappos
*Director of the United States Patent and Trademark Office*